(12) United States Patent
Ryu et al.

(10) Patent No.: US 7,773,356 B2
(45) Date of Patent: Aug. 10, 2010

(54) STACKED SCR WITH HIGH HOLDING VOLTAGE

(75) Inventors: Junhyeong Ryu, Incheon (KR); Taeghyun Kang, Incheon (KR); Moonho Kim, Shiheung-si (KR)

(73) Assignee: Fairchild Korea Semiconductor Ltd, Gyeonggi-Do (KR)

( * ) Notice: Subject to any disclaimer, the term of this patent is extended or adjusted under 35 U.S.C. 154(b) by 233 days.

(21) Appl. No.: 12/051,118

(22) Filed: Mar. 19, 2008

(65) Prior Publication Data

US 2009/0237847 A1   Sep. 24, 2009

(51) Int. Cl.
*H02H 3/20* (2006.01)
*H02H 9/04* (2006.01)

(52) U.S. Cl. .................. 361/56; 361/111; 361/91.1
(58) Field of Classification Search .......... 361/56, 361/111, 91.1
See application file for complete search history.

(56) References Cited

U.S. PATENT DOCUMENTS

| | | | |
|---|---|---|---|
| 5,600,525 A * | 2/1997 | Avery ................ | 361/56 |
| 5,814,538 A * | 9/1998 | Kim et al. .......... | 438/153 |
| 6,016,002 A | 1/2000 | Chen et al. | |
| 6,671,153 B1 | 12/2003 | Ker et al. | |
| 6,707,110 B2 * | 3/2004 | De Heyn et al. ......... | 257/362 |
| 6,791,122 B2 * | 9/2004 | Avery et al. ............. | 257/173 |

* cited by examiner

*Primary Examiner*—Stephen W Jackson
*Assistant Examiner*—Zeev Kitov
(74) *Attorney, Agent, or Firm*—Cesari and McKenna, LLP; Edwin H. Paul, Esq.

(57) ABSTRACT

Stacked SCR's are disclosed with a resistor connecting an internal portion of the upper SCR to an internal portion of the lower SCR. The anode of the protective circuit is connected to a contact on a target circuit to be protected and the cathode of the protective circuit is connected to ground or a reference voltage on the target circuit. The anode voltage is directed to the lower SCR via the resistor such that when the voltage on the anode reaches the triggering voltage of the lower SCR, that SCR triggers and that triggering triggers the upper SCR, such that the stacked SCR's both trigger and thereby limit the voltage between the anode and the cathode and thereby protecting the target circuit.

10 Claims, 6 Drawing Sheets

STACKED SCR WITH HIGH HOLDING VOLTAGE

BACKGROUND OF THE INVENTION

1. Field of the Invention

The present invention relates to ESD (electrostatic discharge) protection devices, and more particularly to SCR type components that protect a signal line of a target circuit by shunting that line to ground or to a reference point or voltage; and even more particularly to stacking SCRs to protect a target circuit.

2. Background Information

Modern electronic circuitry is smaller, denser and more susceptible to electrostatic discharge events than circuitry of years past. For example, noise generated by the integrated circuits may inadvertently trigger a protection device, e.g. an SCR, and possibly damage the device. If the protective device is damaged, it may not protect the circuitry intended, and, if inadvertently triggered, it may render the circuitry inoperative. Typically when a SCR is triggered, power must be completely removed from the device to reset it back to an off state.

In prior art high voltage integrated circuitry (HVIC), a protective SCR may be triggered due to an ESD event, but when the ESD event ends and the regular power supply voltage returns, the SCR will remain on if the holding voltage is below the regular power supply voltage. In this case, the SCRs will hold down the power supply line making the target circuit inoperative. For example, if the HV power supply was +20V, a protective SCR may trigger at +40V, but the holding voltage may be +12.5V or so. Here the still on SCR's will compete with the power supply possibly damaging one or the other. In such a case the power to the SCR must be lowered below the holding voltage (or the power completely removed) to turn off the SCR. One approach to this problem may include stacking SCRs so that the holding voltage doubles. But, in such cases, the triggering voltage also doubles and may be too high. This dilemma has plagued the SCR circuitry for many years.

U.S. Pat. No. 6,671,153 approaches the above dilemma by stacking diodes in series with an SCR. The holding voltage is the sum of the holding voltage of the SCR plus the forward diode drops of the diodes. This may raise the holding voltage to a suitable level, but the triggering level may become too high requiring other techniques to lower to a useful level.

U.S. Pat No. 6,016,002 ('002) illustrates stacking two SCR's. However, the net effect is simple to stack two independent SCRs where the holding voltage doubles, but where the triggering voltage also doubles.

In more detail FIGS. 1 and 2, herein, are FIGS. 5 and 6 from the '002 patent. Note that in FIG. 1, SCR 128 is a separate circuit that is stacked directly onto the independent circuit SCR 126. Other than the connection 124, the SCR's are separate and independent. Therefore, the characteristics of the SCR 128 simply add to the characteristics of SCR 126. Both the holding and the triggering voltages of the individual SCR's 128 and 126 add to each other.

It would be advantageous to stack two SCRs, where the holding voltage doubles, but where the triggering voltage remains that of a single SCR.

SUMMARY OF THE INVENTION

The present invention provides for stacking at least two SCR's, wherein the stacked SCR's demonstrate the triggering voltage of a single SCR while the holding voltage is the sum of the two stacked SCR's.

The present invention provides a protective circuit for protecting a target circuit against an ESD event. The protective circuit has an anode connected to a contact on the target circuit and a cathode to be connected to a reference contact on the target circuit. Usually, as mentioned above, the contact on the target circuit is a Vdd or an input/output contact, and the reference contact is usually ground. When and ESD event triggers the protective circuit, the voltage across the contact on the target circuit to the reference contact on the target circuit is limited, thereby protecting the target circuit.

Illustratively, a first PNP transistor with an emitter is connected to the protective circuit anode, a collector is connected to the base of a first NPN transistor, and a base is connected to the collector of the first NPN transistor. A first resistor is connected from the anode to the base of the first PNP transistor. The first PNP and NPN and resistor form a first SCR, SCR1. The collector of the first NPN transistor is connected to the emitter and to the base of a second PNP transistor and to the collector of a second NPN transistor. The collector of the second PNP transistor is connected to the base of the second NPN transistor, the emitter of the second NPN transistor is connected to the cathode, and a second resistor is connected to the base of the second NPN transistor and to the cathode. The second PNP, NPN and the second resistor form a second SCR, SCR2. SCR1 is stacked above SCR2. A third resistor is connected to the collector of the first NPN transistor to the collector of the second NPN transistor. When the circuit protecting the target circuit is off, the voltage at the anode is transferred to a trigger point in the lower SCR, wherein this lower SCR triggers when the threshold for the single lower SCR is reached. The triggering of the lower SCR triggers the supper SCR wherein the stacked SCR's provide a low voltage clamping of between the anode and the cathode of the protective circuit and thereby limiting the voltage appearing across the target circuit.

Herein the term "connect" in its various forms is defined broadly to include other components that do not substantially interfere with the transfer of electrical signals. For example as used herein, "connect" includes coupling two points with passive resistors or other components that do not impeded the transfer of electrical signals.

The P+ and N+ diffusions for the SCR's are isolated from other components by deep P-type diffusions into a P-type substrate layer. The SCR's structure lies on top of an N-type buried layer, wherein the N-type buried layer provides a resistive connection between the N electrode of the upper SCR and the N electrode of the lower SCR. This resistive path shunts the voltage from the anode to the lower SCR which will trigger when the threshold of the lower (single) SCR is reached. When the lower SCR triggers it triggers the upper SCR. In this case both SCR's are triggered, lowering the voltage of the contact being protected to the holding voltage sum of the two triggered SCR's in series. Both SCR's are in their low voltage conduction states. However, when the ESD event ends, the holding voltage is that of the stacked SCR's since the PN junctions involved are stacked upon one another, and the resistive connection has no effect since the PN junctions dominate.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 3:
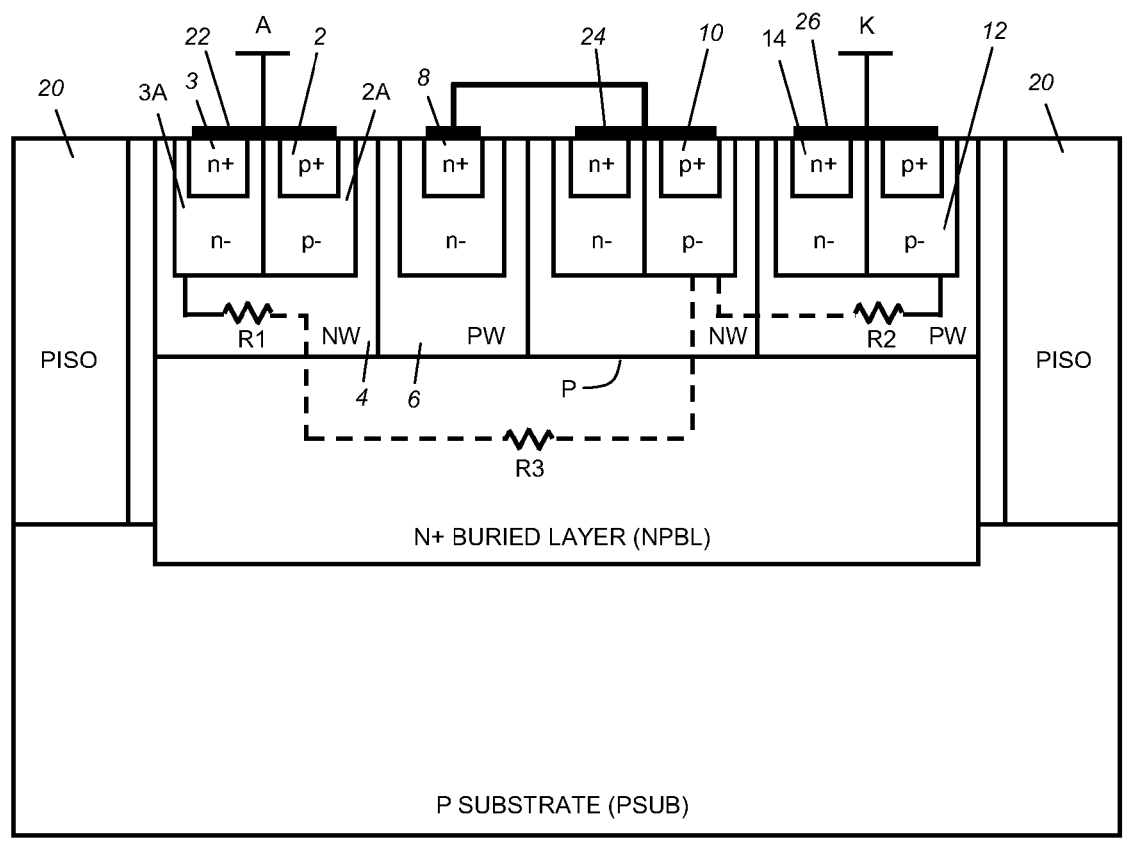
FIG. 3 is a cut away integrated circuit structure illustrating the present invention.
Figure 4:
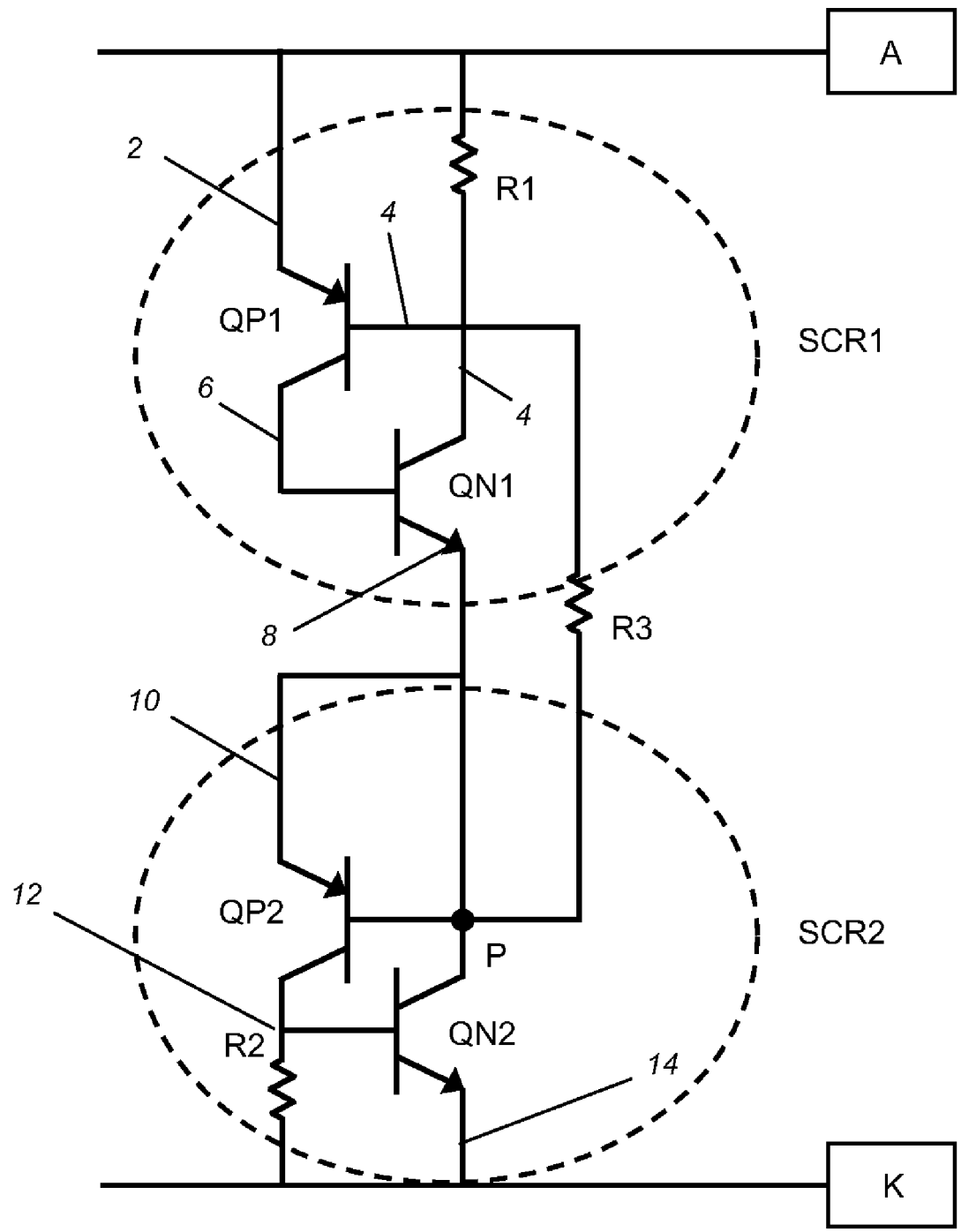
FIG. 4 is a circuit diagram of the structure of FIG. 3.

FIG. 3 is a cross section view of an integrated circuit structure illustrating the present invention, and FIG. 4 illustrates a circuit illustration for the integrated circuit structure of FIG. 3. The circuit components of FIG. 4 are illustrated on FIG. 3, but, as known to those skilled in the art, the cross section integrated circuit to circuit diagram is inexact since points in the circuit diagram are areas in the cross section drawing. However, those skilled in the art will understand the relationship.

Of note, R3 connects the NW 4 (n-well) to the NW P (p-well) and to points 8 and 10 via metallization. This connection joins an internal point of the top SCR1 and an internal point of the bottom SCR2, and allows the circuit characteristics discussed below.

Figure 1:
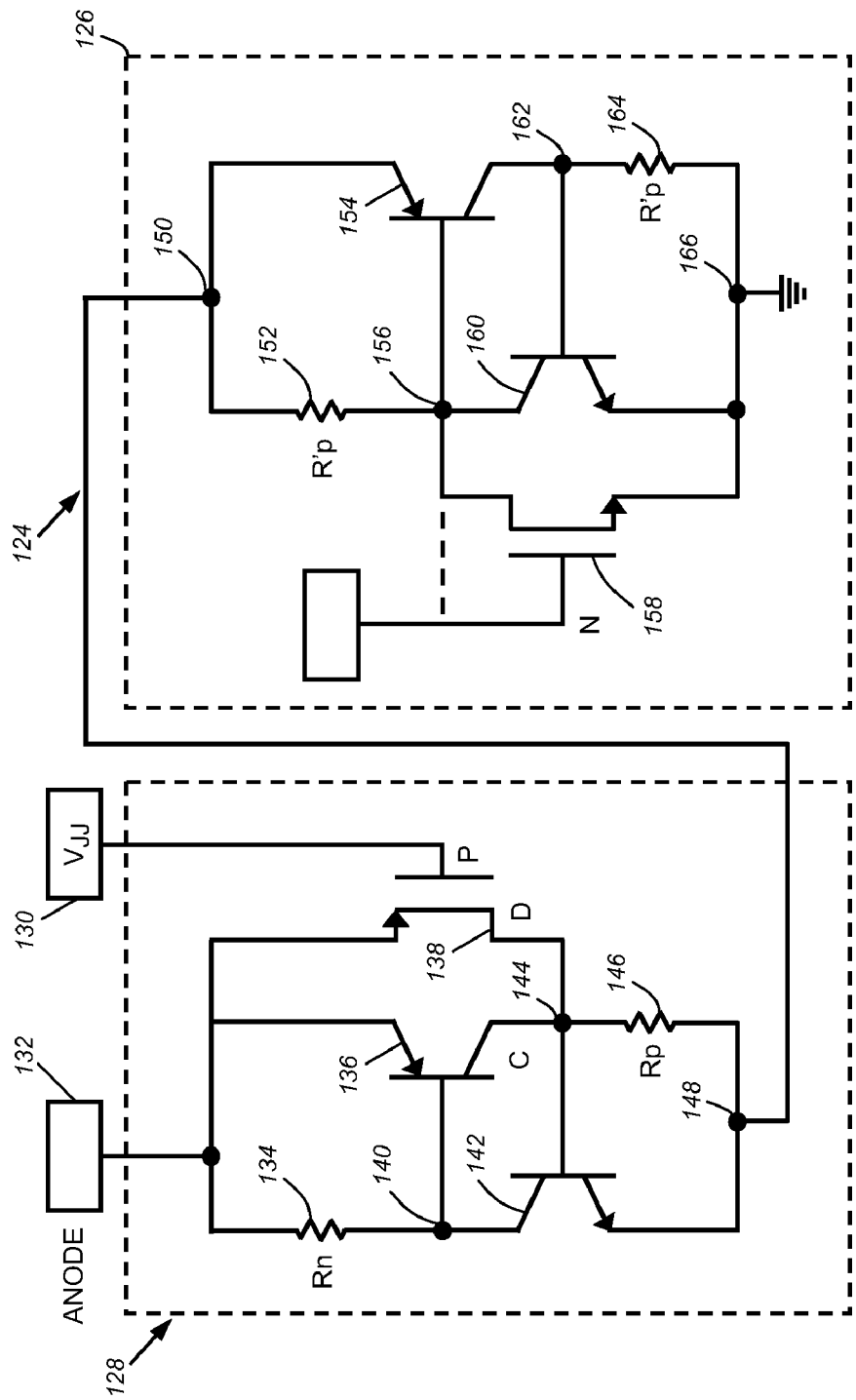
FIG. 1 is a prior art circuit from U.S. Pat. No. 6,016,002.
Figure 2:
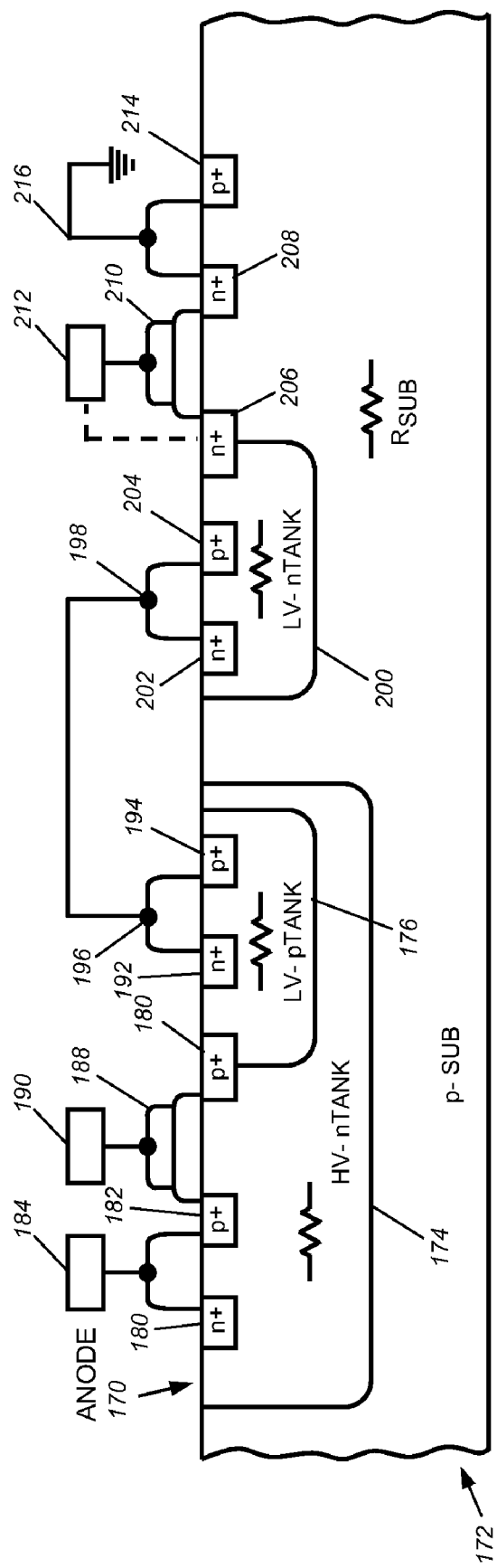
FIG. 2 is a prior art cut away of an integrated circuit structure of the circuit in FIG. 1.

Location A is connected to a node in a circuit (not shown) that is to be protected from ESD. Note that when the structure of FIGS. 3 and 4 is off (not triggered) the bipolar transistors shown are all non-conducting or off. That means that the voltage at point A (the anode of the protective circuit) will appear at point P via R1 and R3. No current travels through R1 and R3. By comparison to FIGS. 1 and 2 where the prior art simply connected the cathode of a top SCR to the anode of the bottom SCR, the present invention via R3 connects an internal circuit point of the top SCR1 to an internal point P in the bottom SCR2. Point P would be a typical trigger input to SCR2, if it were alone.

The net effect is the point A may rise (due to an ESD event) to the trigger point of the single SCR2, SCR2 will fire. This lowers the voltage of point 8 the emitter of QN1 to the holding voltage of SCR2. At this point, the voltage level of point 4 is high enough (via the divider of R3 and R1) above the voltage at point 8 to trigger SCR1. This protects the anode, point A, by lowering the anode voltage point A to the sum of the holding voltage of SCR1 and SCR2. When the SCR's are triggered, the turned on transistors QP1 and 2 and QN1 and 2 will determine the anode voltage, when the protective circuit is triggered, the resistors R1 and R3 (and R2) will not determine the anode voltage.

The following describes the structures of FIGS. 3 and 4 for understanding. The anode, point A, is connected via the p+ contact 2 which forms the p-type emitter of QP1. The equivalent resistance of the n-well (NW) to the n+ contact 3 forms R1 of FIG. 4. The NW 4 forms the n-type base of QP1 and the n-type collector of QN1. The p-well 6 (PW) is the collector of QP1 and the base of QN1. Note that this connection need not be brought to the surface of the structure as the operation does not need any external contact.

FIGS. 3 and 4 show metalization connecting points 8, the n-type emitter of QN1, to 10, the p-type emitter of QP2 and point P, the n-type base of QP2 and the n-type collector of QN2. Item 12 is the p-type collector of QP2 and the p-type base of QN2. The resistor R2 is formed of the equivalent resistor between the p-type area 12 and the n-type 14 connected to point K (the cathode of the protective circuit).

Figure 5:
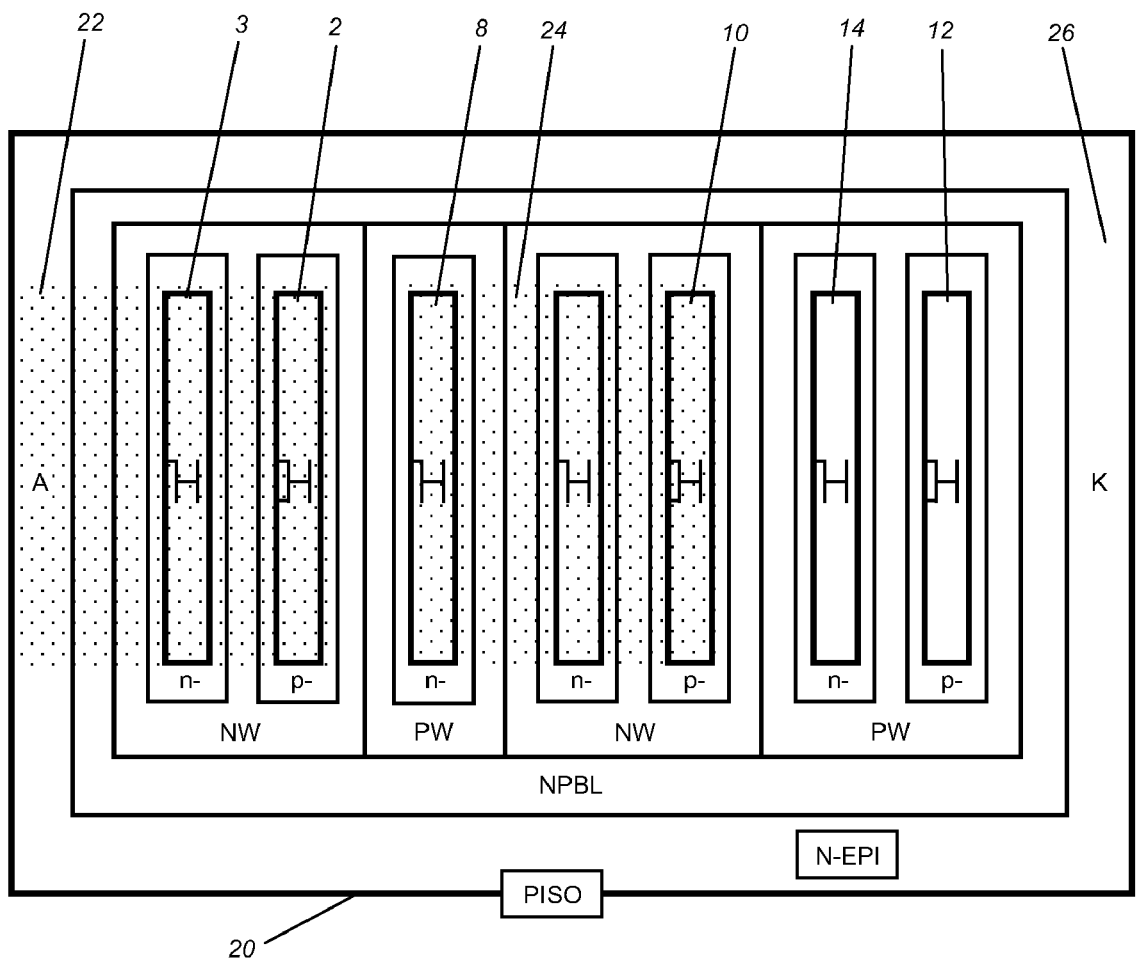
FIG. 5 is a top view of a chip made in accordance with the present invention.

Referring to FIGS. 3 and 5, note below the n+ (high dose) diffusion 3 there is an n− (low dose) diffusion 3A, and below the p+ (high dose) diffusion 2, there is a p− (low dose) diffusion 2A. Beneath each of the high dose (n+ and p+) diffusions along the top of the integrated circuit of FIG. 3, there is a low dose (p− and n−) diffusion, respectively. The net effect of a low dosed diffusions lying under the high dosed diffusions is decrease the triggering voltage and increase the holding voltage of the individual SCR's. The terms "high" and "low" dose are terms of art understood by those skilled in the art.

The present invention provides characteristics of lowered triggering and increased holding voltages illustratively due to the circuit implementation along with the diffusions shown in FIGS. 3, 4 and 5.

FIG. 5 is a top view of the integrated circuit of FIGS. 3 and 4. The metallization 22 connecting A to contact 2 and 3; the metallization 24 connecting points 8 and 10; and the metallization 26 connecting point K to points 14 and 12 are shown. The entire circuit is isolated by the p-type diffusion 20, PISO, that surround the circuit.

Figure 6:
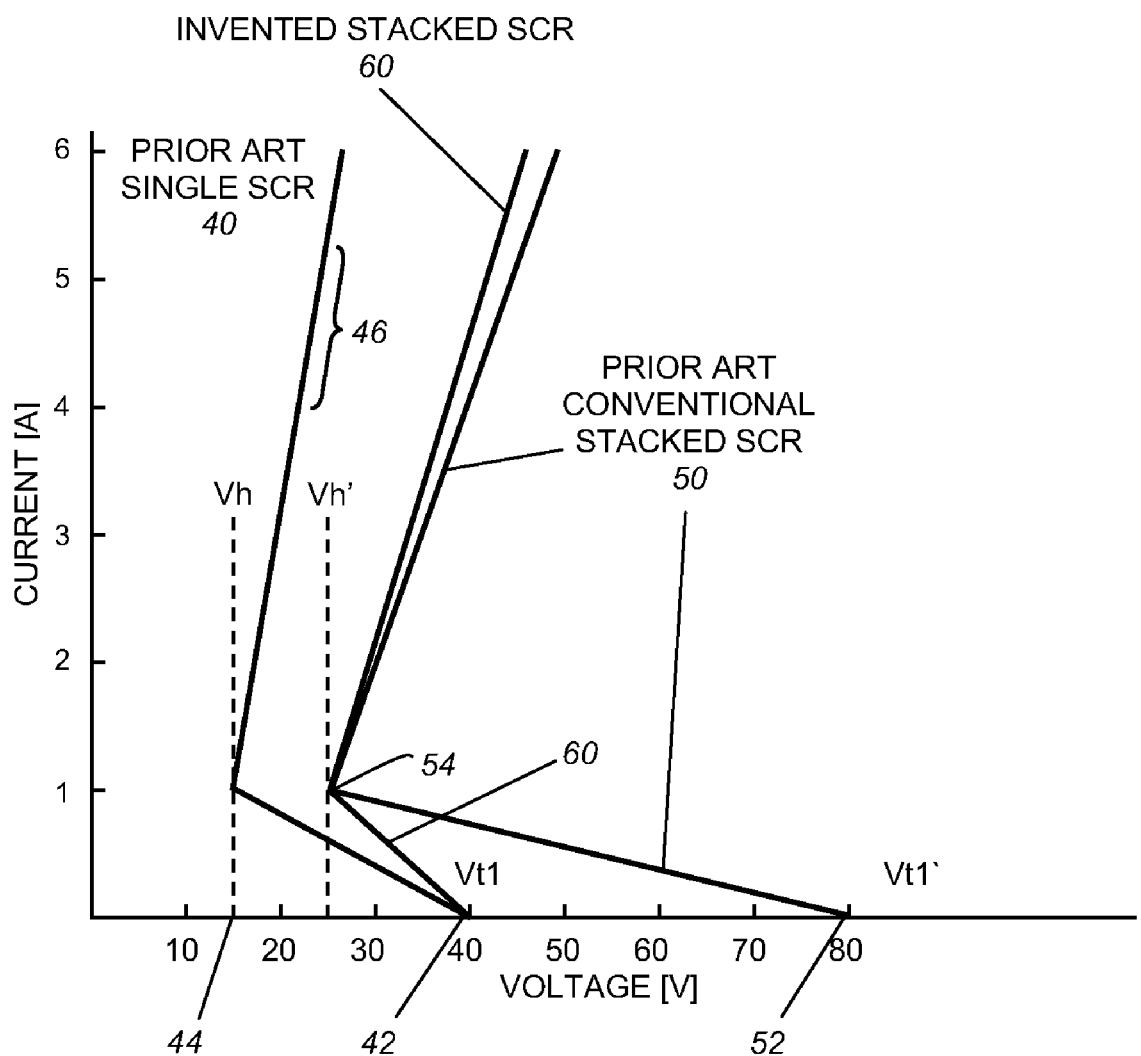
FIG. 6 is a chart of holding and triggering voltage of the present invention compared to prior art structures.

FIG. 6 illustrates the inventive effect of the present invention. The trace 40 is the voltage/current characteristic of a prior art SCR. In this case the triggering voltage is about 40V, marked as item 42, and when triggered the holding voltage 44 is about 12.5V. In such a case, if the Vdd power supply voltage for a circuit (not shown) being protected were +20V, when the ESD event ended the voltage on the SCR would revert to +20 voltage and the SCR would not reset. If another ESD event occurred the SCR would connect all the current possible along the trace contour 46 possibly destroying the circuits and the SCR.

If two SCR's were stacked, the triggering voltage would double to +80V, item 52. However, the holding voltage would also double, in this case to about +25V, item 54. In this case, if the stacked SCR were used with a Vdd of +20V, the SCR's would be reset by the Vdd going to +20V, which is lower than the doubled holding voltage. However, the +80 triggering voltage may be too high for protection.

In any event the simple stacking may not be sufficient to protect circuits.

The present invention provides the trace marked 60 in FIG. 6. Here the trigger voltage is point 42 (40V) which is the trigger voltage for a single SCR, while the holding voltage is at item 53 or about +25V, which is the holding voltage of the stacked SCR's.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A protective circuit for a target circuit against an ESD event, the circuit comprising:
   the protective circuit having an anode and a cathode, the anode connected to a contact on the target circuit;
   the cathode connected to a reference contact on the circuit, wherein, when the protective circuit triggers due to the ESD event, the voltage between the contact and the reference contact on the target circuit is limited, thereby protecting the target circuit;
a first PNP transistor with an emitter connected to the anode, a collector connected to the base of a first NPN transistor, and a base connected to the collector of the first NPN transistor;
a first resistor connected from the anode to the base of the first PNP transistor;
the emitter of the first NPN transistor connected to the emitter and the base of a second PNP transistor and to the collector of a second NPN transistor;
the collector of the second PNP transistor connected to the base of the second NPN transistor, the emitter of the second NPN transistor connected to the cathode;
a second resistor connecting the base of the second NPN transistor to the cathode; and
a third resistor connecting the collector of the first NPN transistor to the collector of the second NPN transistor.

2. The protective circuit of claim 1 wherein the reference contact is ground.

3. The protective circuit for a target circuit of claim 1 wherein the first PNP and NPN and resistor form an upper SCR that is stacked on top of a second SCR comprises of the second PNP, NPN and resistor.

4. The protective circuit for a target circuit of claim 1 wherein the triggering voltage for the protective circuit is the triggering voltage for the second SCR, but wherein the holding voltage of the protective circuit is the sum of the holding voltages for the first SCR and the second SCR.

5. The protective circuit for a target circuit of claim 1 wherein the emitter of the first PNP transistor is a high dose p-type diffusion with a low dose p-type diffusion beneath the high dose p-type diffusion.

6. The protective circuit for a target circuit of claim 1 further comprising at least one of the high dose n-type and p-type diffusions have a low dose n-type and p-type diffusions, respectively, beneath the high dose diffusions.

7. The protective circuit for a target circuit of claim 1 wherein all of the high dose n-type and p-type diffusions have an n-type and a p-type low dose diffusions, respectively, beneath the high dose diffusions.

8. The protective circuit for a target circuit of claim 1 wherein the protective circuit for a target circuit includes an n-type high dose buried layer beneath the entire circuit for protecting the target circuit.

9. A method for protecting a target circuit against an ESD event, the method comprising the steps of:
connecting an anode of a protective circuit to a contact on the target circuit;
connected a cathode of the protective circuit to a reference contact on the circuit;
wherein when the protective circuit triggers due to the ESD event, the voltage between the contact and the reference contact on the target circuit is limited, thereby protecting the target circuit;
connecting an emitter of a first PNP transistor to the anode;
connecting a collector to the base of a first NPN transistor;
connecting a base to the collector of the first NPN transistor;
connecting a first resistor between the anode to the base of the first PNP transistor;
connecting the emitter of the first NPN transistor to the emitter and the base of a second PNP transistor and to the collector of a second NPN transistor;
connecting a the collector of the second PNP transistor to the base of the second NPN transistor;
connecting the emitter of the second NPN transistor to the cathode;
connecting a second resistor between the base of the second NPN transistor and the cathode; and
connecting a third resistor between the collector of the first NPN transistor and the collector of the second NPN transistor.

10. An ESD protection device comprising:
the protective device having an anode (A) and a cathode (K), the anode (A) connected to a contact on the target circuit;
the cathode (K) connected to a reference contact on the circuit, wherein, when the protective device triggers due to the ESD event, the voltage between the contact and the reference contact on the target circuit is limited, thereby protecting the target circuit;
a first n type well (4), the first n type well (4) comprising:
a first low dose N regions (3A) formed in the n type well (4), a high dose n+ region (3) formed in the low dose n− region (3A); and a low dose p− region (2A) formed in the n type well 4, and a high dose p+ region (2) formed in the low dose p− regions (2A);
a connection (22) from the high dose n+ regions (3) to the high dose p+ region (2) connected to the anode (A);
a first p type well (6) adjacent to the first n type well (4), the first p type well 6 comprising a second low dose n− region formed in the first p type well (6), and a high dose n+ region (8);
a second n type well adjacent to the first p type well (6), the second n type well comprising:
a low dose p− regions formed in the second n type well and a high dose p+ region (10) formed in the low dose p− region; and a low dose n− regions formed in the second n type well and a high dose n+ regions (24) formed in the second n type well;
a conductive connection (24) from the high dose n+region (24) to the high dose p− region (10); and a additional conductive connection from the conductive connection (24) to the high dose n+region (8);
a second p type well adjacent to the second n type well, the second p type well comprising:
a low dose p− regions (12) formed in the second p type well, and a high dose p+region formed in the low dose p− region (12);
a low dose n− region formed in the second p type well (12), and a high dose n+ region (14) formed in the low dose n− region;
a conductive connection (26) from the high dose n+ region (14) to the high dose p+ region formed in the low dose p− region (12), and to the cathode (K);
a high dose N+ buried layer formed beneath the fist n type well (4), the second n type well, the first p type well (6) and the second p type well; wherein the high dose N+ buried layer is formed above a P type substrate; and wherein the anode (A) connects through the high dose n+ region (3), the low dose n− region (3A), the first n type well (4), the high dose N+ buried layer (R3), the second n type well to the low dose p− region in the second n type well, wherein a signal at the anode (A) is connected to the junction of the low dose p− region in the second n type well.

* * * * *

UNITED STATES PATENT AND TRADEMARK OFFICE
CERTIFICATE OF CORRECTION

Page 1 of 1

PATENT NO.         : 7,773,356 B2
APPLICATION NO.    : 12/051118
DATED              : August 10, 2010
INVENTOR(S)        : Junhyeong Ryu et al.

It is certified that error appears in the above-identified patent and that said Letters Patent is hereby corrected as shown below:

Col. 5, Claim 3, line 24, delete "comprises" and insert --comprised--;
Col. 5, Claim 9, line 51, delete "connected" and insert --connecting--;
Col. 5, Claim 9, line 61, delete "to" and insert --and--;
Col. 6, Claim 9, line 1, delete "a";
Col. 6, Claim 10, line 11, delete "the" and insert --a--;
Col. 6, Claim 10, line 20, delete "N regions" and insert --n-region--;
Col. 6, Claim 10, line 24, delete "regions" and insert --region--;
Col. 6, Claim 10, line 25, delete "regions" and insert --region--;
Col. 6, Claim 10, line 34, delete "regions" and insert --region--;
Col. 6, Claim 10, line 36, delete "regions" and insert --region--;
Col. 6, Claim 10, line 37, delete "regions (24)" and insert --region--;
Col. 6, Claim 10, line 40, delete "(24)";
Col. 6, Claim 10, line 40, delete "p-" and insert --p+--;
Col. 6, Claim 10, line 40, delete "a" and insert --an--;
Col. 6, Claim 10, line 45, delete "regions (12)" and insert --region--;
Col. 6, Claim 10, line 49, delete "(12)";
Col. 6, Claim 10, line 54, delete "fist" and insert --first--.

Signed and Sealed this
Twenty-second Day of March, 2011

David J. Kappos
*Director of the United States Patent and Trademark Office*